(12) United States Patent
Messerly

(10) Patent No.: US 6,308,192 B1
(45) Date of Patent: Oct. 23, 2001

(54) METHODS AND APPARATUS FOR ADAPTIVE FILTERS

(75) Inventor: Shayne Messerly, Farmington, UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/201,351

(22) Filed: Nov. 30, 1998

(51) Int. Cl.[7] .................................................. G06F 17/10
(52) U.S. Cl. ............................................................ 708/322
(58) Field of Search ...................... 708/322, 323

(56) References Cited

U.S. PATENT DOCUMENTS

| | | | |
|---|---|---|---|
| 4,649,505 | * 3/1987 | Zinser, Jr. et al. | 708/322 |
| 4,771,396 | * 9/1988 | South et al. | 703/322 |
| 5,001,661 | * 3/1991 | Corleto et al. | 708/322 |
| 5,245,561 | * 9/1993 | Sugiyama | 708/322 |

* cited by examiner

Primary Examiner—David H. Malzahn
(74) Attorney, Agent, or Firm—Workman, Nydegger & Seeley

(57) ABSTRACT

The present invention relates to improved adaptive filtering techniques and architectures. Preferably, this filtering is performed as part of the digital processing that occurs with a digital signal processor. It is a feature of this invention that the adaptive filtering taught herein provides the advantages of both serial and parallel architectures, without the accompanying disadvantages thereof. In particular, an adaptive filter is taught that possesses low pin counts, fast processing times suitable for high-speed applications and reduced numbers of filter elements. In a preferred embodiment, the inputs and outputs of the adaptive filter are supplied to and from the adaptive filter in a serial manner while the processing is performed internally within the adaptive filter in a parallel manner. The parallel processing is preferably effected by a delayed least-means-squares algorithm implemented using a single adder, a single multiplier and a single multiplier-accumulator instead of by numerous such adders, multipliers and multiplier-accumulators.

19 Claims, 2 Drawing Sheets

METHODS AND APPARATUS FOR ADAPTIVE FILTERS

BACKGROUND OF THE INVENTION

1. The Field of the Invention

The present invention relates generally to digital processing. More specifically the present invention relates to improved adaptive filtering techniques and architectures as part of that digital processing.

2. The Relevant Technology

Digital processing, and more particularly digital signal processing, is the practice of representing signals with a sequence of numbers and then processing those numbers digitally—often via software—to effect changes to the signal or to extract information from the signal. To a lesser extent, digital processing also creates signals by calculating a sequence of numbers representative of a desired signal waveform.

Some advantages of processing signals in this manner include: consistency, because software does not require tuning as it does not age with time or vary according to temperature; flexibility, because changes to software are more easily implemented than with discrete components; and adaptability, because of the unique nature of software to adapt itself to an incoming signal.

In general, a digital signal processor (DSP) architecture includes an analog-to-digital convertor supplying a digital representation of an input signal to a processor and a digital-to-analog convertor for reconstructing the digital signal back into an analog signal after processing. The digital representation of the input signal is generally a sequence of numbers constructed from discrete time "samples."

Processing of the digital representation of the input signal by the processor is performed largely by one of three functions, addition, multiplication or delay. Addition and multiplication are generally mathematical functions, whereas delay is generally the processing of a previous sample. All are well known in the art.

Within the processor, as part of the DSP architecture, are digital filters that change the relative amplitudes of various frequency components of the digital signal or eliminate some frequency components entirely. Many filter types exist. Some are adaptive while others are fixed. Yet, most are characterized according to whether their impulse response is finite (FIR) or infinite (IIR). Each has advantages and disadvantages over the other. In general, two design considerations are implicated. They are: (i) how many filter elements or taps are required to achieve a desired frequency response; and (ii) what are the proper coefficient values needed in doing so? FIR filters typically estimate the number of taps needed and then redesign the filter if the taps are too few or too many. IIR filters, on the other hand, usually have fewer taps in comparison to a FIR filter.

With either filter design, the least-means-squares (LMS) algorithm is one of the most widely used methods for achieving an optimized filter design. This algorithm, and its delay counterpart, the delayed LMS (DLMS), are representative of the following discussion. It should be appreciated, however, that other algorithm and methods are also equally applicable.

In general, conventional LMS and DLMS adaptive filters utilize either serial or parallel style architectures. In serial architectures, the digital representation of the input signal, or digital signal, that is being processed is serially passed into and out of the filter. As for engineering considerations, such as pin count and speed of processing the digital signal, the pin count is advantageously low while the speed of processing is disadvantageously slow. Thus, this architecture is not suitable for many high-speed/precision uses.

In contrast, parallel architectures pass the digital signal into and out of the filter in a parallel manner. Thus, the speed of processing is fast but the pin count is high. As such, this architecture is input/output (I/O) bound.

Regardless of whether the architecture is serial or parallel in nature, conventional D/LMS adaptive filters contain numerous filter elements, such as adders, multipliers, etc., for performing the functions of addition, multiplication and delay. During manufacturing, this leads to high economic costs in time and labor. Also, since these elements require large amounts of physical space, silicon costs are high.

Accordingly, it would be an advance to provide improved adaptive filters having the advantages of both serial and parallel architectures without having the disadvantages thereof. In particular, it would advance the present state of the art to have adaptive filters with low pin counts, fast processing times, suitable for high-speed applications, and reduced numbers of filter elements.

OBJECTS AND SUMMARY OF THE INVENTION

It is, therefore, an object of the present invention to provide an improved adaptive filter for use in processing digital signals.

It is another object of the present invention to provide an improved adaptive filter architecture suitable for achieving one or all of the following: low pin counts, fast processing times or reduced numbers of filter elements.

It is still another object of the present invention to provide an improved LMS or DLMS adaptive filter suitable for use with a DSP having a VLSI architecture.

It is yet another object of the present invention to provide an adaptive filter having reduced numbers of filter elements and reduced computational complexity for calculating accurate filter coefficients.

It is still yet another object of the present invention to provide an economically improved adaptive filter.

In accordance with the invention as embodied and broadly described herein, the foregoing and other objectives are achieved by providing improved adaptive filtering techniques and architectures. Preferably, this filtering is performed as part of the digital processing that occurs within a digital signal processor. It is a feature of this invention that the adaptive filtering taught herein provides the advantages of both serial and parallel architectures, without the accompanying disadvantages thereof. In particular, an adaptive filter is taught that possesses low pin counts, fast processing times suitable for high-speed applications and reduced numbers of filter elements.

In a preferred embodiment, the inputs and outputs of the adaptive filter are supplied to and from the adaptive filter in a serial manner while the processing is performed internally within the adaptive filter in a parallel manner. The parallel processing is preferably effected by a delayed least-means-squares algorithm implemented using a single adder, a single multiplier and a single multiplier-accumulator.

These and other objects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention will be rendered by reference to specific embodiments thereof which are illustrated in the appended drawings. Understanding that these drawings depict only typical embodiments of the invention and are not therefore to be considered to be limiting of its scope, the invention in its presently understood best mode for making and using the same will be described and explained with additional specificity and detail through the use of the accompanying drawings in which.

DETAILED DESCRIPTION OF THE PREFERRED EMBODIMENTS

The present invention relates to improved adaptive filtering techniques and architectures. Preferably, this filtering is performed as part of the digital processing that occurs with a digital signal processor. It is a feature of this invention that the adaptive filtering taught herein provides the advantages of both serial and parallel architectures, without the accompanying disadvantages thereof. In particular, an adaptive filter is taught that possesses low pin counts, fast processing times suitable for high-speed applications and reduced numbers of filter elements.

Figure 1:
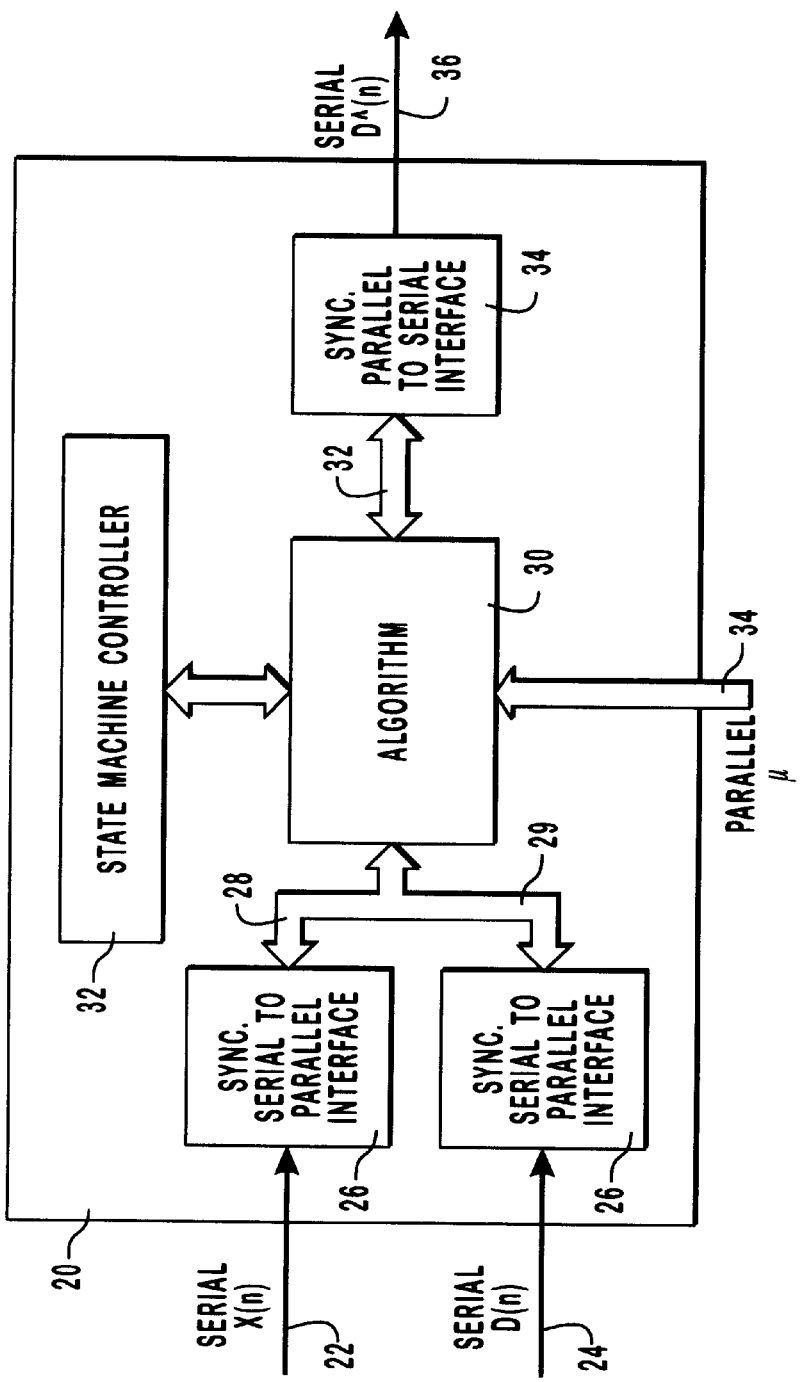
FIG. 1 is a diagram of an architecture supportive of an adaptive filter in accordance with the present invention.

With reference to FIG. 1, a preferred architecture supportive of an adaptive filter in accordance with the present invention is depicted as 20. Supplied to the adaptive filter 20 is a serial input signal 22 and a desired response signal 24, also in serial input form. In general, the serial input signal 22, represented mathematically as a function, X(n), is the signal whose content is trying to be ascertained. When this adaptive filtering is performed as a portion of the digital processing that takes place with a digital signal processor (DSP), the serial input signal 22 will most likely be supplied via a convertor such as an analog-to-digital convertor, codec, etc. Since the serial input signal 22 is an unknown signal, the desired response signal 24, represented mathematically as a function, D(n), is a signal that is a desired representation thereof. Both are well known in the art.

Once supplied to the adaptive filter, each of the serial input signal and the desired response signal are converted into a parallel equivalent. One or more synchronous serial to parallel interface devices 26 receive their respective serial inputs and convert them into a parallel equivalent. In particular, the serial input signal 22 is converted into a parallel input signal 28 and the desired response signal is converted into a parallel equivalent at 29. These signals are provided on bi-directional lines and are diagrammatically thick to indicate that they are in a parallel format. In contrast, when these signals are in a serial format, they are indicated as relatively thin lines, such as where serial input signal 22 is supplied to the adaptive filter 20. An exemplary synchronous serial to parallel interface device includes, but is not limited to, shift registers.

Once converted, the serial input signal 22 becomes a parallel input signal 28 and is supplied to an adaptive filter algorithm 30. Via synchronous control from a state machine controller 32 and a gain input, $\mu$, 34, which controls stability and the rate of convergence within the adaptive filter, as described in detail subsequently, the adaptive filter algorithm effects the filtering algorithm on the parallel input signal. Thereafter, a parallel output signal 32 is produced. This output, represented mathematically as a function, D^(n), is convergent upon the desired response signal, D(n). Convergence is well known in the art and not described herein in additional detail.

It will be appreciated that the output of the adaptive filter algorithm is in a parallel format. Thus, a synchronous parallel to serial interface device 34 is provided to convert the parallel format of the output into a serial equivalent D^(n) illustrated as a serial output signal 36. The parallel to serial interface device 34 is preferably comprised of shift register(s).

Figure 2:
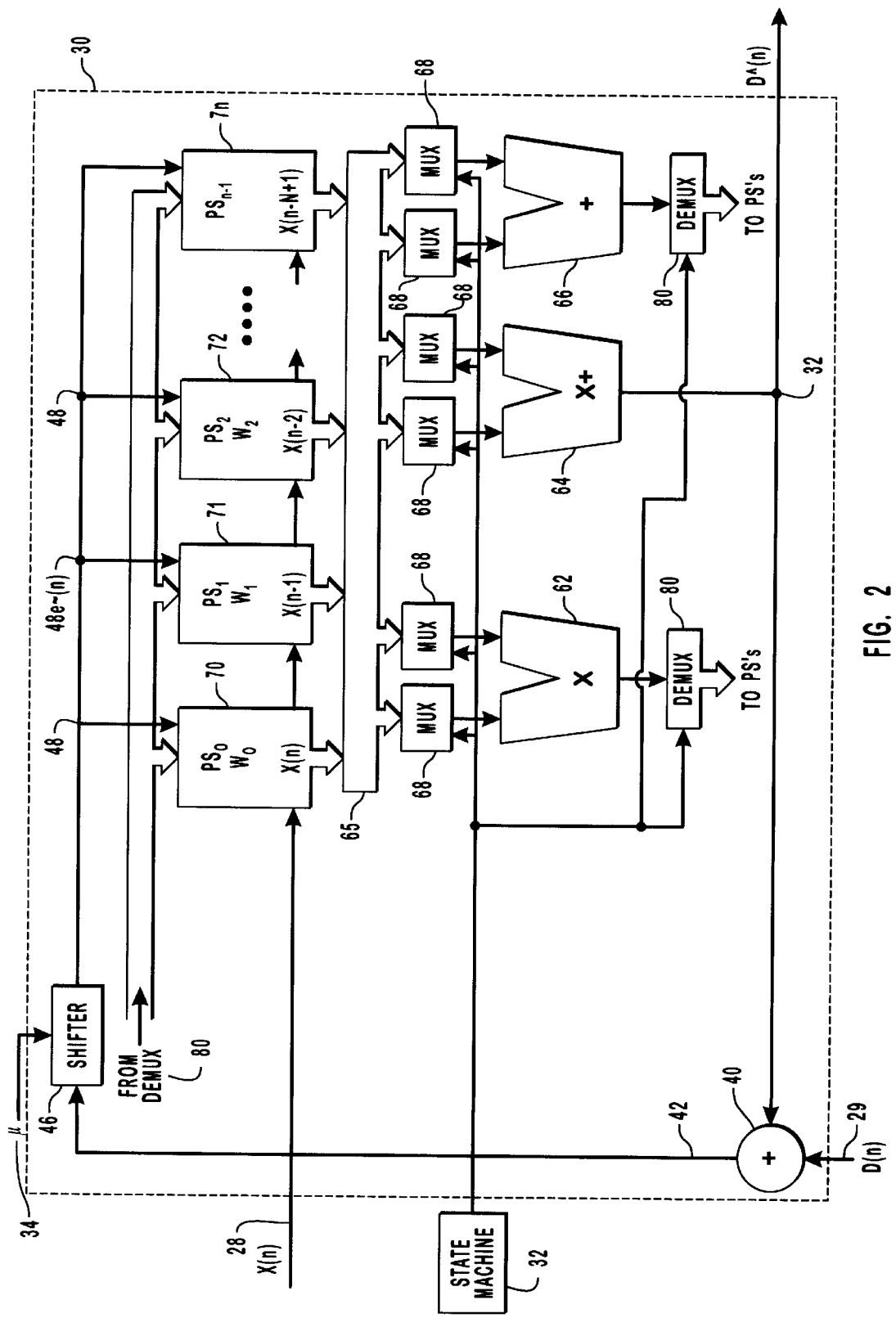
FIG. 2 is a diagram of an architecture supportive of effecting a delayed least-means-squares algorithm on an input signal in accordance with the present invention.

From the foregoing architecture, it will be appreciated that the input signals supplied to the adaptive filter 20, such as the serial input signal 22 and the desired response signal 24, and the output signals generated and supplied from the adaptive filter are all serial in format. Whereas, the processing performed within the adaptive filter, such as in the adaptive filter algorithm 30, is performed in a parallel format. As such, twofold benefits are realized. For example, low pin counts are attainable with this architecture because of the serial manner in which signals are supplied to and from the adaptive filter. Fast processing times, suitable for high-speed applications, are also attained because the processing is performed in a parallel fashion. Also, the further advantage of having reduced numbers of filter elements is achieved with this architecture and will be particularly described with reference to FIG. 2.

In this figure, the adaptive filter algorithm 30 is described in the context of a delayed least-means-squares algorithm (DLMS). It will be appreciated, however, that other algorithms are also able to benefit from this architecture. For example, the algorithm could be that of a recusive-lease-squares filter (RLS). Still other algorithms are intimated by this architecture that are well known to those skilled in the art and, thus, the following should be construed as exemplary and not restrictive.

As before, the inputs supplied to the adaptive filter algorithm 30 comprise a parallel input signal 28, X(n), a desired response signal 29, D(n), in parallel format and a gain input, $\mu$, 34. The output from the adaptive filter still comprises a parallel output signal D^(n) 32.

In general, the adaptive filter algorithm is applied to the parallel input signal 28 such that the parallel output signal D^(n) converges upon the desired response signal D(n). As is known in the art, the output of an adaptive filter is a function of several iterations that utilize present, as well as previous, inputs. As such, a feedback loop is routed in relation to the parallel output signal D^(n) to achieve the desired iterative results.

In a preferred embodiment, this feedback comprises the routing of an output of a multiplier 62, a multiplier-accumulator 64 and an adder 66, via various routes, back as an input of the multiplier 62, the multiplier-accumulator 64 or the adder 66. With respect to the multiplier 62 and the adder 66, the routing comprises a bus 65 supplying input to one or more multiplexers 68. The multiplexers 68 are configured at an input of the respective multiplier or adder. A demultiplexer 80 is configured at an output thereof. The demultiplexers 80 then supply one of the storage elements 70, 71, 72 ... 7n. The ones column of the reference numerals in the 70's, for the storage elements, corresponds to the processing state, PS, such as processing state zero, $PS_0$, processing state one, $PS_1$, processing state two, $PS_2$, or processing state "n," $PS_n$. Each of the processing states will be described in additional detail below. The output of the storage elements is then supplied as an input to the bus 65.

With respect to the multiplier-accumulator 64, the routing comprises a multiplexer 68 supplying the input to the multiplier-accumulator 64. The output thereof is the parallel output signal D^(n) which is routed in two directions. One direction is out from the adaptive filter 30 and the other direction is into a summation device 40 for creating an error signal. This error signal, e(n), 42 is configured at an output of the summation device and is the difference between the desired response signal 29 and the parallel output signal 32. Mathematically, e(n)=D(n)−D^(n).

This error signal, e(n), 42 is then supplied to a shifter 46, such that an output thereof 48, e~(n), is e(n) multiplied by the gain factor, $\mu$, 34. In mathematical form: e~(n)=($\mu$)×(e(n)).

Thereafter, e~(n) 48 and the parallel input signal 28, x(n), are combined in one of the storage elements 70, 71, 72, . . . 7n. To complete the feedback loop, the output of the storage elements are supplied to the bus 65 and then to one or more of the multiplexers 68.

It will be appreciated that the foregoing architecture effects an adaptive filter algorithm on the parallel input signal with a single multiplier 62, a single multiplier-accumulator 64 and a single adder 66. This greatly advances the state of the art because it is no longer required to have numerous such devices. This saves time during manufacturing because only three devices need to be fabricated. This also saves physical space required to implement this architecture which translates into an economically improved design because less silicon, for example, is required during manufacturing.

EXAMPLE

The following serves to illustrate one cycle of the iterative process performed by the foregoing architecture. The coefficients, W, of the adaptive filter 30 are updated within their respective state using present and previous inputs such that the ith processing state performs the following set of calculations:

$$W_i(n+1)=W_i(n)+X\sim(n); \quad 1)$$

$$X\sim_{i+1}(n)=X_{i+1}(n)\times e\sim(n-1); \quad 2)$$

and $$D\hat{}_i(n)=D\hat{}_{i-1}(n)+W_i(n)\times X_i(n); \quad 3)$$

where, $$W(n)=W(n-1)+[\mu\times e(n-1)\times X(n)];$$

$$D\hat{}(n)=W(n)*X(n);$$

$$e(n)=D(n)-D\hat{}(n);$$

and $$e\sim(n)=\mu\times X(n).$$

Then, at time n:

$$X\sim_0(n)=X_0(n)\times e\sim(n); \; D\hat{}(n)=0.$$

The processing states are as follows:

Processing State 0

$$W_0(n+1)=W_0(n)+X\sim_0(n);$$

$$X\sim_1(n)=(n)\times e\sim(n);$$

Processing State 1

$$W_1(n+1)=W_1(n)+X\sim_1(n);$$

$$X\sim_2(n)=X_2(n)\times e\sim(n);$$

$$D\hat{}(n)=D\hat{}(n)+[W_0(n+1)\times X_0(n)];$$

Processing State 2

$$W_2(n+1)=W_2(n)+X\sim_2(n);$$

$$X\sim_3(n)=X_3(n)\times e\sim(n);$$

$$D\hat{}(n)=D\hat{}(n)+[W_1(n+1)\times X_1(n)];$$

until

Processing State N−1

$$W_{n-1}(n+1)=W_{n-1}(n)+X\sim_{n-1}(n);$$

$$D\hat{}(n)=D\hat{}(n)+[W_{n-2}(n)\times X_{n-2}(n)].$$

The parallel output signal 32 D^(n) is:

$$D\hat{}(n)=D\hat{}(n)+[W_{1-1}(n)\times X_{n-1}(n)].$$

With a valid parallel output signal, update X(n), e(n) and W(n+1) into W(n).

Although the foregoing describes a preferred architecture for implementing the present invention, it will be appreciated that various alternative embodiments are intimated herein. For example, the functions performed by the single multiplier-accumulator, i.e. multiplying and adding, may also be effectuated by utilizing each of the multiplier and adder in a dual capacity role. Similarly, the functions performed by each of the single multiplier and the single adder may alternatively be combined into the multiplier-accumulator.

While this architecture eliminates the need to have numerous processing blocks, such as multiple multiplier-accumulators, adders, multipliers, etc., nothing prohibits the inclusion of additional such processing blocks. It is just advantageous to perform adaptive filtering, as described herein, with as few processing blocks as possible.

It is also possible to perform adaptive filtering as described herein without first requiring the input signal to be supplied to the adaptive filter as a serial input and then converted into a parallel input. It is possible to merely supply the input signal as a parallel input. In a similar manner, the parallel output signal may also be supplied from the adaptive filter architecture in a parallel manner without undergoing conversion to a serial output signal. These alternatives allow even further advantage because physical space is saved within the adaptive filter and the signal processing does not require multiple parallel to serial, and vice versa, conversions. They, however, adversely increase pin counts.

The multiplexing performed in the foregoing embodiment may alternatively also be performed by a singular multiplexer as opposed to a plurality of multiplexers each arranged at an input of the multiplier, the adder and the multiplier-accumulator. Likewise, the demultiplexers may alternatively be configured into a single demultiplexer.

The gain input 34, $\mu$, may alternatively be supplied to the adaptive filter as a serial input and then converted to a parallel gain input once within the adaptive filter architecture.

Also, it is possible to arrange the foregoing FIR adaptive filter architecture as an IIR filter by providing appropriate feedback, such as from the error signal, e(n), or e~(n), when determining the filter coefficients, W.

The present invention may be embodied in other specific forms without departing from its spirit or essential characteristics. Thus, the described embodiments are to be considered in all respects as illustrative only and not restrictive. The particular scope of the invention is indicated by the appended claims rather than by the foregoing description. All changes that come within the meaning and range of equivalency of the claims are to be embraced within their scope.

What is claimed is:

1. An adaptive filter for processing a serial input signal, comprising:

means for converting said serial input signal into a parallel input signal;

means for effecting an adaptive filter algorithm on said parallel input signal, said parallel input signal having said adaptive filter algorithm effected thereon being a parallel output signal, said means including a single multiplier, a single adder and a single multiplier-accumulator with said parallel input signal provided to at least one of said single multiplier, adder and multiplier-accumulator, said single multiplier, adder and multiplier-accumulator being arranged functionally in a parallel arrangement with a common bus multiplexing between said single multiplier, adder and multiplier-accumulator, said means further receiving a desired response signal for convergence by said parallel output signal toward said desired response signal; and means for converting said parallel output signal into a serial output signal.

2. The adaptive filter according to claim 1, wherein said means for converting said serial input signal into a parallel input signal is a shift register.

3. The adaptive filter according to claim 1, wherein said means for converting said parallel output signal into a serial output signal is a shift register.

4. The adaptive filter according to claim 1, wherein said parallel output signal is obtained at an output of said multiplier-accumulator.

5. The adaptive filter according to claim 1, further comprising a multiplexer, said multiplexer for multiplexing said parallel input signal before supplying said parallel input signal to said at least one of said single multiplier, adder and multiplier-accumulator.

6. The adaptive filter according to claim 5, further comprising a state machine controller for controlling said multiplexer.

7. The adaptive filter according to claim 5, further comprising a demultiplexer for demultiplexing an output of one of said multiplier and said adder.

8. The adaptive filter according to claim 7, wherein the demultiplexer is machine controlled.

9. The adaptive filter according to claim 1, further comprising a gain input supplied to said means for effecting said adaptive filter algorithm on said parallel input signal, said gain input for controlling a rate of convergence of said adaptive filter.

10. An adaptive filter for use with a digital signal processor, said digital signal processor for processing an input signal as a digital representation thereof, said adaptive filter comprising:

means for receiving said digital representation as a serial input signal;

means for converting said serial input signal into a parallel input signal;

means for receiving a desired response signal, said desired response signal being a desired representation about-which said adaptive filter converges;

means for combining said desired response signal with a feedback input signal into an error signal;

means for combining said error signal and said parallel input signal into a combined signal;

a single multiplier, a single adder and a single multiplier-accumulator, said combined signal being supplied to at least one of said single multiplier, adder and multiplier-accumulator, an output of said adder and said multiplier being supplied to said means for combining said error signal and said parallel input signal into said combined signal, an output of said multiplier-accumulator being a parallel output signal convergent upon said desired response signal, said parallel output signal being said feedback input signal;

a signal bus for supplying said combined signal to said at least one of said single multiplier, adder and multiplier-accumulator;

at least one multiplexer between said signal bus and each of said single multiplier, adder and multiplier-accumulator;

a state machine controller for providing synchronization on said at least one multiplexer; and means for converting said parallel output signal into a serial output signal.

11. The adaptive filter according to claim 10, further comprising a multiplexer, said multiplexer for multiplexing said combined signal before supplying said combined signal to said at least one of said single multiplier, adder and multiplier-accumulator.

12. The adaptive filter according to claim 11, further comprising a demultiplexer for demultiplexing an output of one of said multiplier and said adder, said demultiplexer being between said output of said adder and said multiplier and said means for combining.

13. The adaptive filter according to claim 12, wherein the demultiplexer is machined controlled.

14. The adaptive filter according to claim 12, further comprising a state machine controller for controlling a state of said multiplexer.

15. A method for processing an input signal in an adaptive filter, comprising the steps:

supplying said input signal to said adaptive filter in a serial manner;

converting said input signal into a parallel input signal;

supplying a desired response signal to said adaptive filter in a serial manner;

converting said desired response signal into a parallel representation thereof;

effecting an adaptive filter algorithm on said parallel input signal to achieve a parallel output signal, said parallel output signal being convergent upon said desired response signal, wherein said step of effecting said adaptive filter algorithm on said parallel input signal further comprises:

a. providing said parallel input signal to first inputs of a plurality of storage elements, each of said plurality of storage elements being operatively coupled to a common bus via a plurality of outputs from said plurality of storage elements;

b. providing an error signal resulting from a combination of said desired response signal and said parallel output signal to second inputs of said plurality of storage elements; and c. selectively supplying via said common bus one of said plurality of outputs from said storage elements to one of a multiplier, an adder, and a multiplier-accumulator;

converting said parallel output signal into a serial output signal; and supplying said serial output signal from said adaptive filter.

16. The method according to claim 15, further comprising the step of demultiplexing an output of each of said multiplier and said adder.

17. The method according to claim 16, further comprising the step of creating an error signal by adding said parallel representation of said desired response signal and said parallel output signal.

18. The method according to claim 17, further comprising the step of multiplying said error signal by a gain input to form an error tilde signal.

19. The method according to claim 18, further comprising the step of supplying said error tilde signal to a storage element, said parallel input signal and said output of said each of said multiplier and said adder being supplied to said storage element.

* * * * *